(12) United States Patent
Sudo

(10) Patent No.: US 11,482,259 B2
(45) Date of Patent: Oct. 25, 2022

(54) POWER DOWN DETECTION CIRCUIT AND SEMICONDUCTOR MEMORY DEVICE

(71) Applicant: Winbond Electronics Corp., Taichung (TW)

(72) Inventor: Naoaki Sudo, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/347,613

(22) Filed: Jun. 15, 2021

(65) Prior Publication Data
US 2022/0005511 A1   Jan. 6, 2022

(30) Foreign Application Priority Data

Jul. 2, 2020 (JP) .............................. JP2020-114633

(51) Int. Cl.
*G11C 5/14* (2006.01)
*G05F 1/46* (2006.01)
*G11C 11/4074* (2006.01)

(52) U.S. Cl.
CPC .............. *G11C 5/147* (2013.01); *G05F 1/465* (2013.01); *G11C 11/4074* (2013.01); *G11C 5/148* (2013.01)

(58) Field of Classification Search
CPC ...... G11C 6/147; G11C 11/4074; G05F 1/465
See application file for complete search history.

(56) References Cited

U.S. PATENT DOCUMENTS

| | | | | |
|---|---|---|---|---|
| 6,492,863 B2* | 12/2002 | Kono | ..................... | G11C 5/145 327/540 |
| 7,457,161 B2* | 11/2008 | Sakurai | ................... | G11C 5/147 365/189.11 |
| 2002/0027234 A1* | 3/2002 | Kato | ....................... | G11C 5/147 257/E27.097 |
| 2009/0039951 A1* | 2/2009 | Sako | ....................... | G11C 5/147 327/543 |
| 2009/0160542 A1* | 6/2009 | Jeon | ......................... | G11C 7/20 327/545 |
| 2010/0188920 A1* | 7/2010 | Futatsuyama | .......... | G11C 5/147 365/207 |
| 2016/0254057 A1 | 9/2016 | Katou | | |
| 2021/0351771 A1* | 11/2021 | Arakawa | ............... | G06F 1/3203 |

FOREIGN PATENT DOCUMENTS

| CN | 104167223 | 11/2014 |
|---|---|---|
| JP | 6494139 | 4/2019 |
| TW | 201913115 | 4/2019 |

* cited by examiner

*Primary Examiner* — Tuan T Nguyen
(74) *Attorney, Agent, or Firm* — JCIPRNET

(57) ABSTRACT

A power down detection circuit that may detect a supply voltage decrease more accurately is provided. The power down detection circuit includes a BGR circuit generating a reference voltage VREF, a resistance division circuit generating a first internal voltage VCC_DIV1 and a second internal voltage VCC_DIV2 based on a supply voltage VCC, a first comparator outputting a reset signal PDDRST when detecting VCC_DIV1<VREF, a second comparator outputting a switching signal SEL when detecting VCC_DIV2<VREF, a charging pump circuit generating a boosted voltage VXX based on the supply voltage VCC, and a switching circuit switching an operating voltage supplied to the BGR circuit to the supply voltage VCC or the boosted voltage VXX based on the switching signal SEL.

11 Claims, 5 Drawing Sheets

POWER DOWN DETECTION CIRCUIT AND SEMICONDUCTOR MEMORY DEVICE

CROSS-REFERENCE TO RELATED APPLICATION

This application claims the priority benefit of Japan application serial no. 2020-114633, filed on Jul. 2, 2020. The entirety of the above-mentioned patent application is hereby incorporated by reference herein and made a part of this specification.

BACKGROUND

Technical Field

The disclosure relates to a semiconductor memory device such as a flash memory, and more particularly to detection of a drop in supply voltage (power down detection).

Description of Related Art

The flash memory includes a power down detection circuit for detecting a drop in a supply voltage VCC caused by noise or peak current consumption. The power down detection circuit may prevent unexpected abnormal operations (for example, a program or erase operation) caused by a low level of the supply voltage VCC. Complementary metal oxide semiconductor (CMOS) circuits or other internal circuits have a range of the supply voltage VCC for accurate operation.

On the other hand, the flash memory also requires power on detection. Therefore, a power down detection level must satisfy the following relationship.

VLLOGIC<VPDD<VPOD<VCC range for accurate operation

VLLOGIC: a limit of the supply voltage VCC for accurate operation of an internal logic circuit
VPDD: power down detection level
VPOD: power on detection level According to this relationship requirement, the flash memory is required to minimize variation of the power down detection level caused by a process/temperature.

FIG. 1 shows a structure of an existing power down detection circuit. A power down detection circuit 10 includes: a band gap reference (BGR) circuit 20, generating a reference voltage VREF based on the supply voltage VCC; a resistance division circuit 30, performing resistance division to the supply voltage VCC and generating an internal voltage VCC_DIV at a node N; and a comparator 40, comparing the reference voltage VREF with the internal voltage VCC_DIV and outputting a reset signal PDDRST shifting from an H level to an L level when detecting VCC_DIV<VREF.

The BGR circuit 20 generates the reference voltage VREF that does not depend on variation or operating temperature of the supply voltage VCC, thereby suppressing variation in the power down detection level. When the supply voltage VCC drops to the power down detection level, the comparator 40 detects VCC_DIV<VREF and outputs the reset signal PDDRST of the L level. The reset signal PDDRST is output to an internal circuit such as a central processing unit (CPU) or a logic circuit, and the internal circuit performs a power down operation in response to the reset signal PDDRST, such as stopping the operation of the charging pump circuit or resetting the CPU or the logic circuit.

FIG. 2 shows an ideal operating waveform of the power down detection circuit 10. For example, the supply voltage VCC is set to 1.8 V, the reference voltage VREF of the BGR circuit 20 is set to 1.2 V, and the power down detection level is set to 1.3 V. At time t1, if the supply voltage VCC drops, the internal voltage VCC_DIV drops accordingly. When the supply voltage VCC drops to 1.3 V at time t2, the internal voltage VCC_DIV and the reference voltage VREF cross each other, which means the comparator 40 detects VCC_DIV<VREF and outputs the reset signal PDDRST of the L level.

If the supply voltage VCC drops further, the BGR circuit 20 may generate a voltage lower than the expected reference voltage VREF. For example, in a design of generating the 1.2 V reference voltage VREF, if the supply voltage VCC drops to about 1.3 V, the reference voltage VREF is sometimes lower than 1.2 V. If so, even if the supply voltage VCC drops to the power down detection level, the comparator 40 is still unable to detect VCC_DIV<VREF, thus causing problems such as a reset failure.

As shown in FIG. 3, at the time t1, the supply voltage VCC drops, and the internal voltage VCC_DIV drops accordingly. At the time t2, the supply voltage VCC drops to the power down detection level. At the time t1A earlier than the time t2, if operations of the BGR circuit 20 become unstable, the reference voltage VREF is reduced. At the time t2, the reference voltage VREF and the internal voltage VCC_DIV do not cross each other, and the comparator 40 is unable to detect the internal voltage VCC_DIV. As a result, power down of the supply voltage VCC may not be detected accurately.

SUMMARY

The disclosure provides a power down detection circuit and a semiconductor memory device that may detect a supply voltage decrease more accurately.

The power down detection circuit of the disclosure has a reference voltage generating circuit, an internal voltage generating circuit, a first detection circuit, a second detection circuit, a boost circuit, and a switching component. The reference voltage generating circuit generates a reference voltage. The internal voltage generating circuit generates a first internal voltage and a second internal voltage lower than the first internal voltage based on the supply voltage. The first detection circuit outputs a power down reset signal when detecting that the first internal voltage is lower than the reference voltage. The second detection circuit outputs a switching signal when detecting that the second internal voltage is lower than the reference voltage. The boost circuit generates a boosted voltage based on the supply voltage. The switching component supplies the supply voltage or the voltage of the boost circuit to the reference voltage generating circuit based on the switching signal.

The semiconductor memory device of the disclosure includes the power down detection circuit and an execution component executing a power down operation in response to a detection result of the first detection circuit of the power down detection circuit.

According to the disclosure, before the supply voltage drops to the power down detection level, the voltage supplied to the reference voltage generating circuit is switched from the supply voltage to the voltage of the boost circuit to stabilize operations of the reference voltage generating circuit within a certain period. During the period, the reference voltage is suppressed from decreasing so that the supply voltage may be detected accurately to drop to the power down detection level.

DESCRIPTION OF THE EMBODIMENTS

The embodiment of the disclosure is described in detail with reference to the drawings. A semiconductor memory device of the disclosure in a preferred aspect is a non-volatile memory such as a NAND or NOR flash memory, a resistance change memory, or a magnetic change memory, or the semiconductor memory device is a microprocessor, a microcontroller, a logic circuit, an application-specific integrated circuit (ASIC), a processor for image or sound processing, a processor for processing signals such as wireless signals, or the like where the non-volatile memory is embedded. The following description takes the NAND flash memory as an example.

Figure 4:
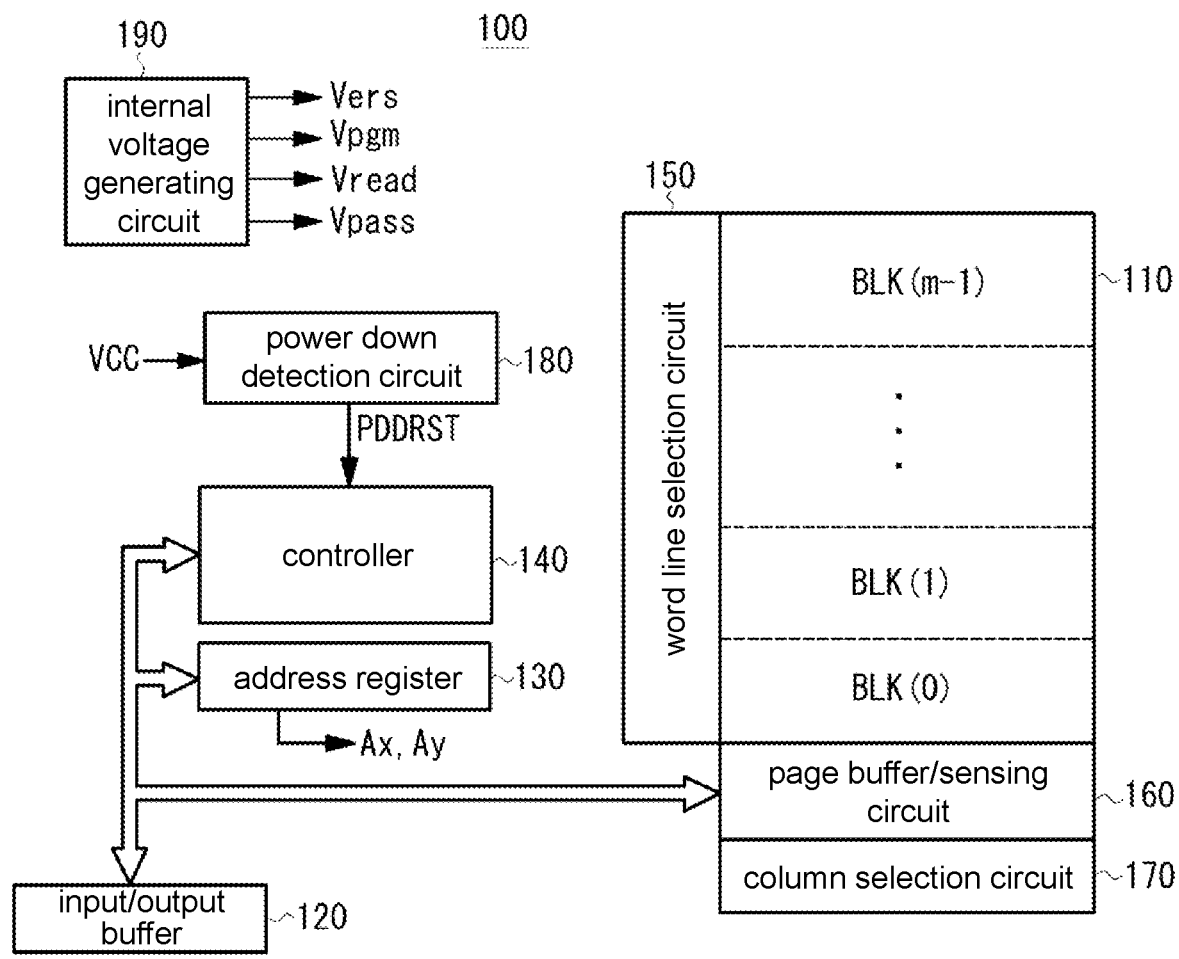
FIG. 4 shows an internal structure of a flash memory according to the embodiment of the disclosure.

A schematic structure of the NAND flash memory according to the embodiment of the disclosure is shown in FIG. 4. A flash memory 100 of this embodiment includes a memory cell array 110 arranging multiple memory cells in a matrix, an input/output buffer 120 connected to an external input/output terminal I/O, an address register 130 receiving address data from the input/output buffer 120, a controller 140 receiving command data and the like from the input/output buffer 120 and controlling each component, a word line selection circuit 150 performing block selection, word line selection, and the like based on a decoding result of row address information Ax from the address register 130, a page buffer/sensing circuit 160 retaining data read from a page selected by the word line selection circuit 150 or retaining data that should be programmed to the selected page, a column selection circuit 170 selecting a column and the like based on a decoding result of column address information Ay from the address register 130, a power down detection circuit 180 outputting a reset signal PDDRST when detecting that a supply voltage VCC supplied to a power terminal has dropped to a power down detection level, and an internal voltage generating circuit 190 generating various voltages (a program voltage Vpgm, a pass voltage Vpass, a read voltage Vread, an erase voltage Vers, and the like) required for reading, programming, and erasing of data.

The memory cell array 110 has m blocks BLK(0), BLK(1), . . . , BLK(m−1) arranged along a column direction. Multiple NAND strings are formed in one block. One NAND string is formed by connecting multiple memory cells (for example, 64 memory cells), bit line side selection transistors, and source line side selection transistors in series. A drain of the bit line side selection transistor is connected to a corresponding bit line, and a source of the source line side selection transistor is connected to a common source line. The NAND string may be two-dimensionally or three-dimensionally formed on a surface of a substrate. In addition, the memory cell may be a single-level cell (SLC) storing 1 bit (binary data) or a type of storing multiple bits.

During a read operation, a certain positive voltage is applied to the bit line, a certain voltage (for example, 0 V) is applied to the selected word line, and a pass voltage Vpass (for example, 4.5 V) is applied to the non-selected word line so that the bit line side selection transistor and the source line side selection transistor are turned on to apply 0 V to the common source line. During a program (write) operation, the high-voltage program voltage Vpgm (15 V to 20 V) is applied to the selected word line, and an intermediate electric potential (for example, 10 V) is applied to the non-selected word line so that the source line side selection transistor is turned off to supply an electric potential corresponding to data of "0" or "1" to the bit line. During an erase operation, 0 V is applied to the selected word line in the block, and a high voltage (for example, 20 V) is applied to a P well.

If the power down detection circuit 180 detects that the supply voltage VCC drops to the power down detection level, the power down detection circuit 180 outputs the reset signal PDDRST shifting from an H level to an L level to the controller 140 or other internal circuits. In response to the reset signal PDDRST, the controller 140 executes a power down operation in accordance with codes read from a read-only memory (ROM) or a random access memory (RAM). During the power down operation, for example, resetting of internal circuits including the controller 140, stopping of a charging pump circuit included in the internal voltage generating circuit 190, or the like are performed.

Figure 5:
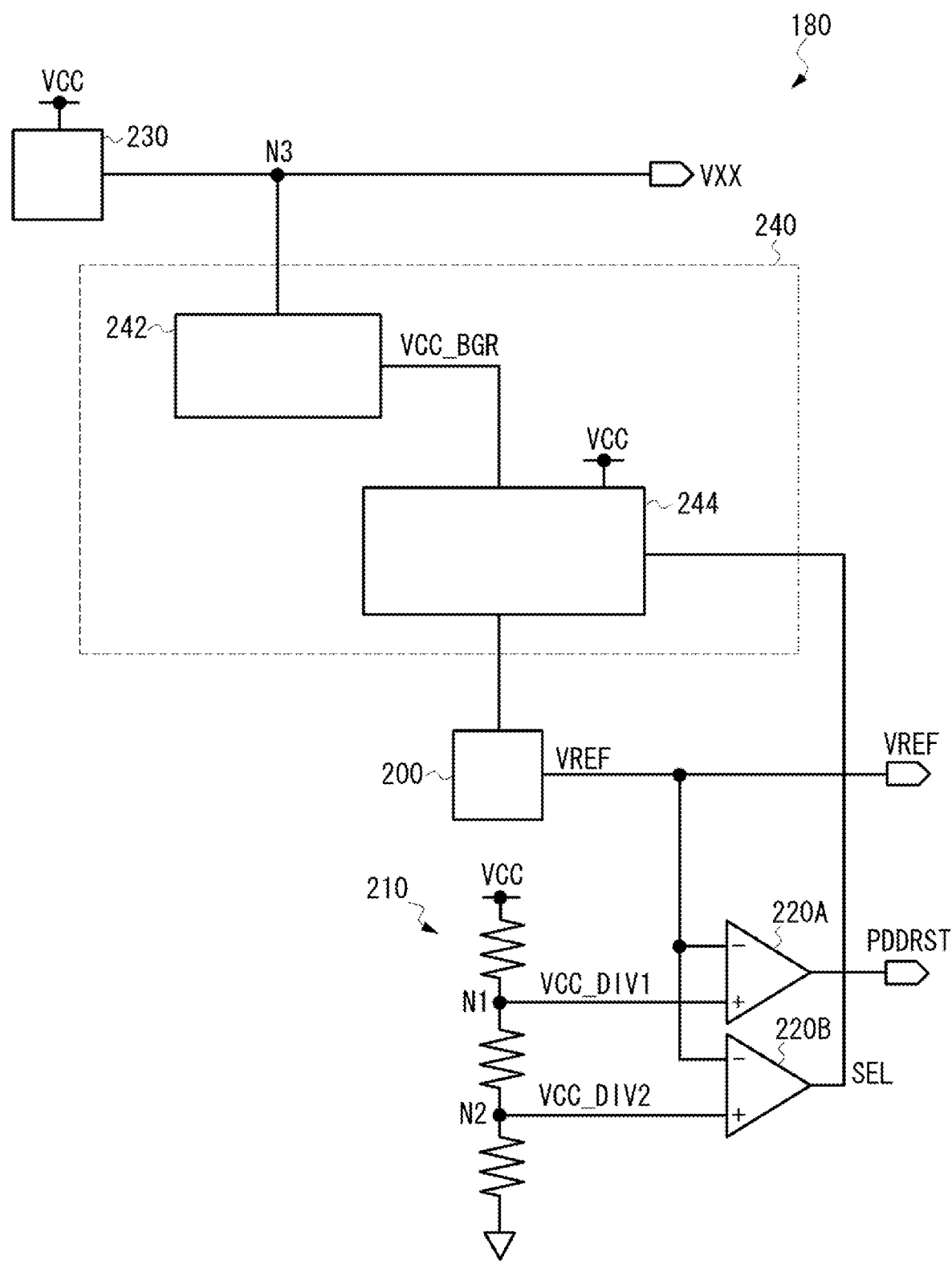
FIG. 5 shows a structure of a power down detection circuit according to the embodiment of the disclosure.

FIG. 5 shows an internal structure of the power down detection circuit 180. The power down detection circuit 180 includes a band gap reference (BGR) circuit 200 generating a reference voltage VREF with less dependence on variation or temperature of the supply voltage VCC, a resistance division circuit 210 generating a first internal voltage VCC_DIV1 at a node N1 based on the supply voltage VCC and generating a second internal voltage VCC_DIV2 lower than the first internal voltage VCC_DIV1 at a node N2, a first comparator 220A comparing the reference voltage VREF with the first internal voltage VCC_DIV1 and outputting the reset signal PDDRST of the L level when detecting VREF>VCC_DIV1, a second comparator 220B comparing the reference voltage VREF with the second internal voltage VCC_DIV2 and outputting a switching signal SEL shifting from the H level to the L level when detecting VREF>VCC_DIV2, a charging pump circuit 230 generating a voltage VXX boosted at an output node N3 based on the supply voltage VCC, and a switching circuit 240 supplying the voltage VXX generated by the charging pump circuit 230 or the supply voltage VCC to the BGR circuit 200 based on the switching signal SEL.

Figure 1:
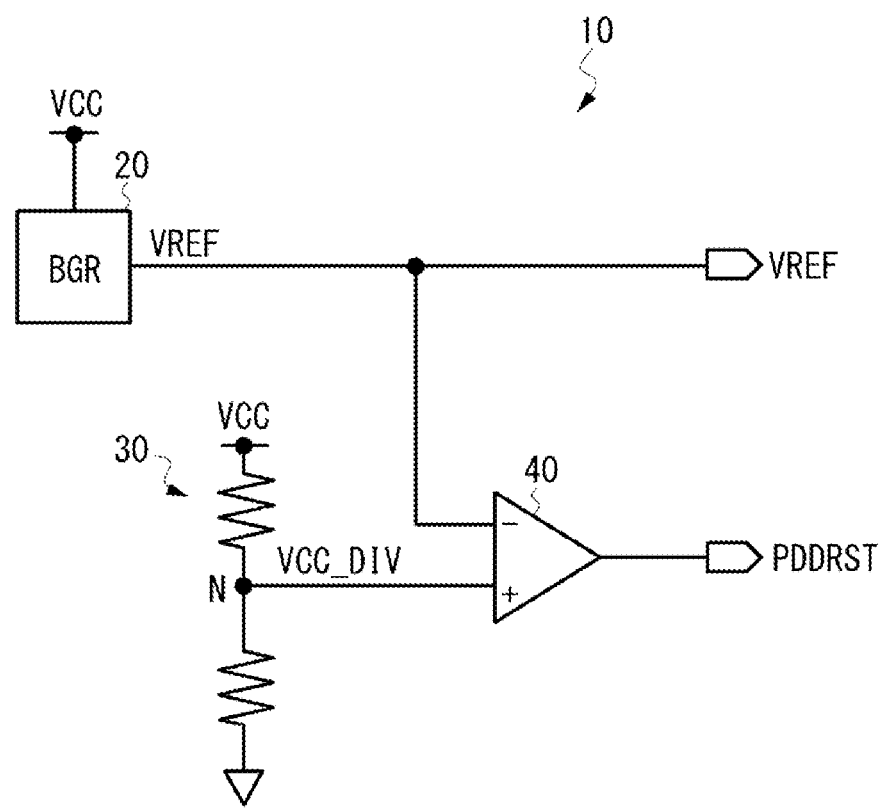
FIG. 1 shows a structure of an existing power down detection circuit.
Figure 2:
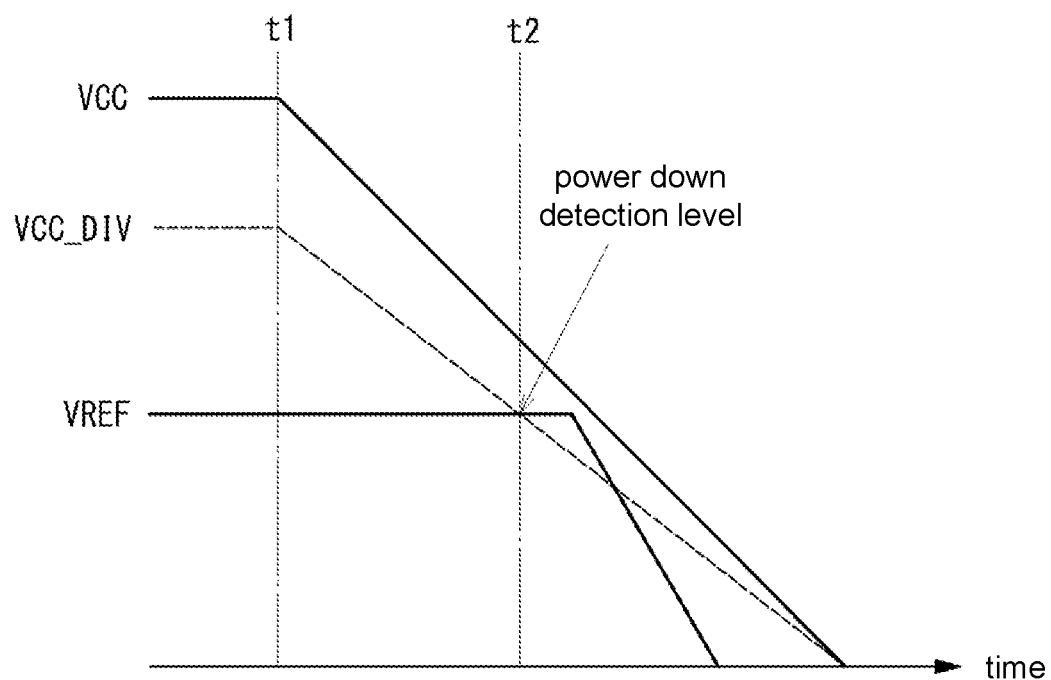
FIG. 2 shows an ideal operating waveform of the power down detection circuit shown in FIG. 1.
Figure 3:
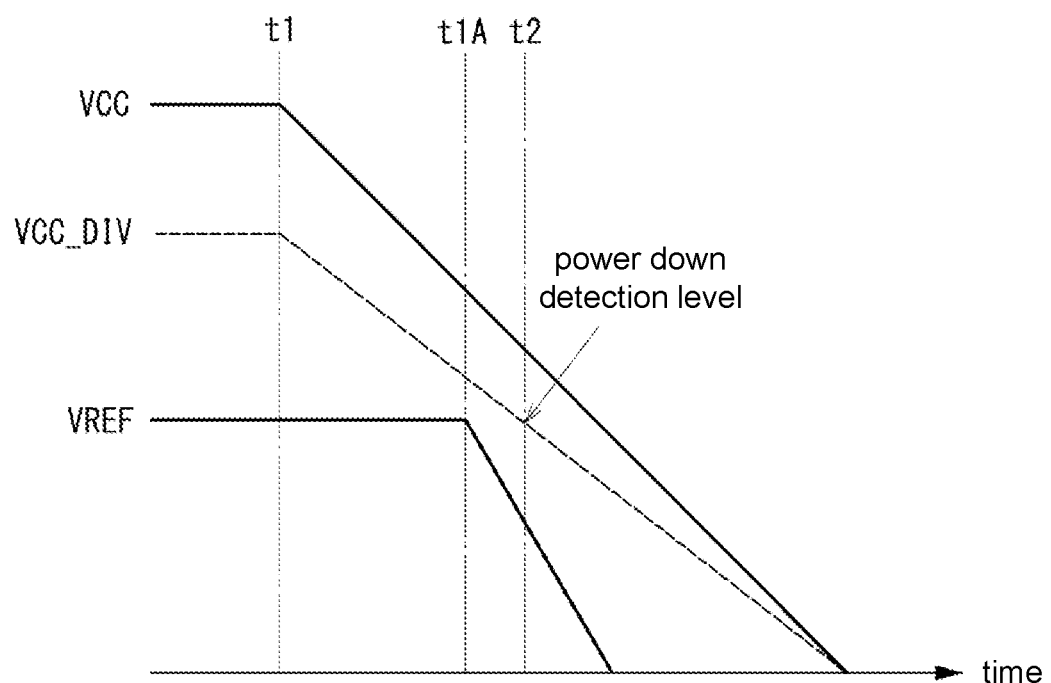
FIG. 3 shows an operating waveform when a reference voltage of a band gap reference (BGR) circuit of the power down detection circuit shown in FIG. 1 is reduced.

The resistance division circuit 210 generates the first internal voltage VCC_DIV1 and the second internal voltage VCC_DIV2. The first internal voltage VCC_DIV1 is the same as the internal voltage VCC_DIV shown in FIG. 1, and is a voltage for setting the power down detection level. The second internal voltage VCC_DIV2 is a voltage for detecting a situation where the supply voltage VCC has dropped to a certain level before dropping to the power down detection level. As described later, for setting a voltage of a switching detection level, the switching detection level is used to switch the power supply to the BGR circuit 200. The first internal voltage and the second internal voltage have a relationship of VCC_DIV2<VCC_DIV1.

In an embodiment, the charging pump circuit 230 is included in the internal voltage generating circuit 190 and operates when the flash memory 100 is in a busy state (not in a standby state). The charging pump circuit 230 generates the various boosted voltages VXX according to the supply voltage VCC. For example, when the supply voltage VCC is 1.8 V, the reading and pass voltages (for example, 6 V), the program voltage (for example, 16 V), the erase voltage (for example, 20 V), and the like are generated. In other embodiments, the charging pump circuit 230 may also be separated from the internal voltage generating circuit 190 and be exclusively set in the power down detection circuit 180. In this case, the charging pump circuit 230 may always be operating regardless of whether the flash memory 100 is in the busy state.

The switching circuit 240 includes a VCC_BGR regulator 242 and a VCC_BGR conversion circuit 244. The VCC_BGR regulator 242 is connected to the node N3 of the charging pump circuit 230, and generates the voltage VCC_BGR used to be supplied to the BGR circuit 200 based on the voltage VXX supplied via the node N3. The voltage VCC_BGR is approximately equal to or lower than the supply voltage VCC (where the BGR circuit may normally generate the voltage of the reference voltage VREF). A circuit structure of the VCC_BGR regulator 242 is not particularly limited, and may be, for example, composed of a resistance division circuit or a comparator.

The VCC_BGR conversion circuit 244 receives the voltage VCC_BGR generated by the VCC_BGR regulator 242 and the supply voltage VCC to supply the voltage VCC_BGR or the supply voltage VCC to the BGR circuit 200 in response to the switching signal SEL of the second comparator 220B. Specifically, when the switching signal SEL is at the H level, the VCC_BGR conversion circuit 244 supplies the supply voltage VCC to the BGR circuit 200, and when the switching signal SEL is at the L level, the VCC_BGR conversion circuit 244 supplies the voltage VCC_BGR to the BGR circuit 200.

Figure 6:
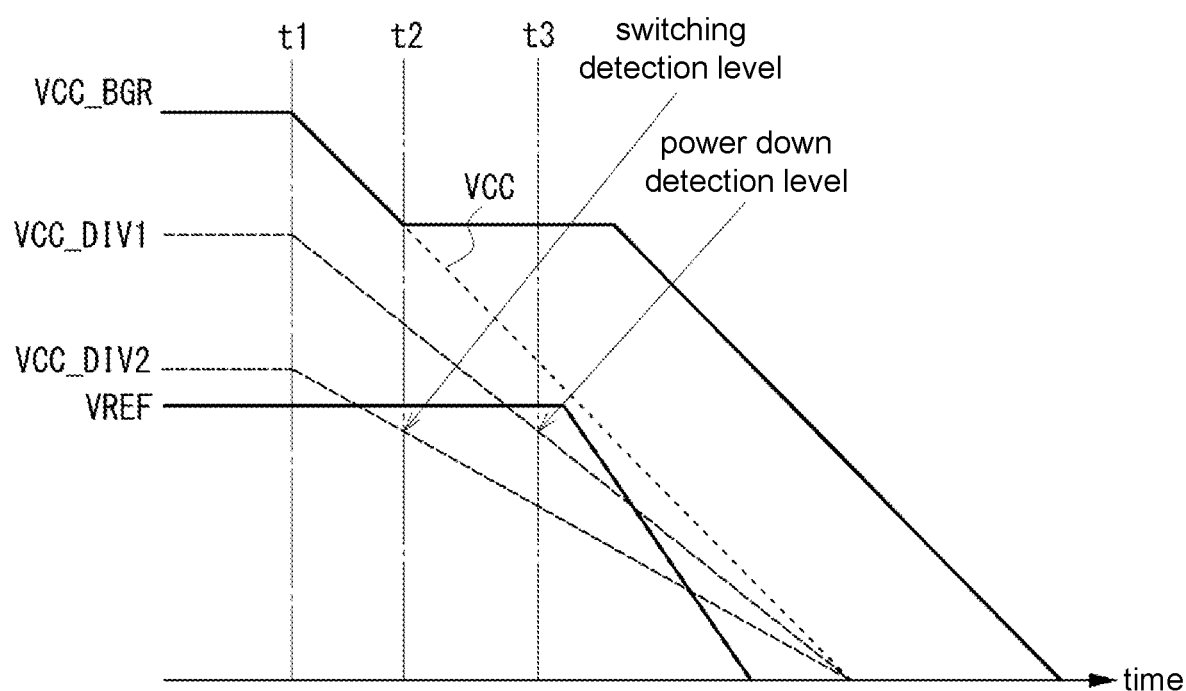
FIG. 6 shows an operating waveform of the power down detection circuit according to the embodiment of the disclosure.

FIG. 6 shows an operating waveform of the power down detection circuit of this embodiment. When the supply voltage VCC is in a normal range, the switching signal SEL is at the H level, and the VCC_BGR conversion circuit 244 supplies the supply voltage VCC to the BGR circuit 200. At time t1, if the supply voltage VCC drops, the first internal voltage VCC_DIV1 and the second internal voltage VCC_DIV2 also drop accordingly.

At time t2, if the supply voltage VCC drops to the switching detection level, the second comparator 220B detects VCC_DIV2<VREF and outputs the switching signal SEL shifting from the H level to the L level. The VCC_BGR conversion circuit 244 switches the voltage supplied to the BGR circuit 200 from the supply voltage VCC to the voltage VCC_BGR generated by the VCC_BGR regulator 242 in response to the switching signal SEL.

After that, even if the supply voltage VCC drops further (shown by a dotted line), with the boosted voltage VXX, the voltage VCC_BGR generated by the VCC_BGR regulator 242 does not drop immediately but maintains the electric potential at a certain level for a certain period. The electric potential at the certain level is maintained by the voltage VCC_BGR, and during the period, the BGR circuit 200 operates stably and generates the desired reference voltage VREF.

At time t3, when the supply voltage VCC drops to the power down detection level, the comparator 220A detects VCC_DIV1<VREF and outputs the reset signal PDDRST shifting from the H level to the L level. The flash memory 100 executes a reset operation in response to the reset signal PDDRST.

If the supply voltage VCC is in the normal range, the BGR circuit 200 generates the desired reference voltage VREF, and if the supply voltage VCC drops further, the reference voltage VREF is concerned to drop. For example, when the reference voltage VREF of the BGR circuit 200 is 1.2 V and the power down detection level is set to 1.3 V, if the supply voltage VCC drops to about 1.3 V, the reference voltage VREF will be lower than 1.2 V. If so, even if the supply voltage VCC drops to the power down detection level, the comparator 220A is still unable to detect VCC_DIV1<VREF.

In this embodiment, before the supply voltage VCC drops to the power down detection level, the voltage VCC_BGR generated according to the voltage VXX generated by boosting the supply voltage VCC is supplied to the BGR circuit 200. In this way, operations of the BGR circuit 200 are ensured to be stable within a certain period. During the period, the reference voltage VREF is suppressed from decreasing so that it may be actually detected that the supply voltage VCC reaches the power down detection level. Furthermore, during a busy period, due to huge power consumption of the flash memory, the supply voltage VCC also drops further. Even if part of electric power of the charging pump circuit 230 is used for the power down detection circuit 180, the overall power consumption is extremely low and causes no problems.

In the embodiment, though the charging pump circuit is exemplified as a circuit boosting the supply voltage VCC, a boost circuit may still be a circuit other than this (for example, a boost DC/DC converter).

Furthermore, the structure of the switching circuit 240 shown in the embodiment serves as an example. In short, the switching circuit 240 may be any circuit as long as the circuit may supply the boosted voltage VCC_BGR or the supply voltage VCC to the BGR circuit 200 based on the switching signal SEL.

The preferred embodiment of the disclosure has been described in detail above, but the disclosure is not limited thereto, and various modifications and changes may be made by persons skilled in the art without departing from the scope of the disclosure as described in the claims.

What is claimed is:

1. A power down detection circuit, comprising:
   a reference voltage generating circuit, generating a reference voltage;
   an internal voltage generating circuit, generating a first internal voltage and a second internal voltage lower than the first internal voltage based on a supply voltage;
   a first detection circuit, outputting a power down reset signal when detecting that the first internal voltage is lower than the reference voltage;
   a second detection circuit, outputting a switching signal when detecting that the second internal voltage is lower than the reference voltage;
   a boost circuit, generating a voltage that is boosted based on the supply voltage; and
   a switching component, supplying the supply voltage or the voltage of the boost circuit to the reference voltage generating circuit based on the switching signal.

2. The power down detection circuit according to claim 1, wherein the switching component supplies the voltage of the boost circuit to the reference voltage generating circuit when the second detection circuit detects that the second internal voltage is lower than the reference voltage.

3. The power down detection circuit according to claim 1, wherein the first internal voltage specifies a power down detection level, and the second internal voltage specifies a switching detection level of the voltage of the boost circuit according to the supply voltage related to the reference voltage generating circuit.

4. The power down detection circuit according to claim 1, wherein the switching component comprises a regulator, generating a certain voltage according to the voltage of the boost circuit, and a conversion circuit, receiving the certain voltage generated by the regulator and the supply voltage, and supplying the certain voltage or the supply voltage to the reference voltage generation circuit based on the switching signal.

5. The power down detection circuit according to claim 1, wherein the internal voltage generating circuit comprises a resistance division circuit.

6. The power down detection circuit according to claim 1, wherein the reference voltage generating circuit comprises a band gap reference circuit.

7. The power down detection circuit according to claim 1, wherein the first detection circuit comprises a first comparator comparing the first internal voltage with the reference voltage, and the second detection circuit comprises a second comparator comparing the second internal voltage with the reference voltage.

8. A semiconductor memory device, comprising:
   a power down detection circuit, comprising:
      a reference voltage generating circuit, generating a reference voltage;
      an internal voltage generating circuit, generating a first internal voltage and a second internal voltage lower than the first internal voltage based on a supply voltage;
      a first detection circuit, outputting a power down reset signal when detecting that the first internal voltage is lower than the reference voltage;
      a second detection circuit, outputting a switching signal when detecting that the second internal voltage is lower than the reference voltage;
      a boost circuit, generating a voltage that is boosted based on the supply voltage; and
      a switching component, supplying the supply voltage or the voltage of the boost circuit to the reference voltage generating circuit based on the switching signal; and
   an execution component executing a power down operation in response to a detection result of the first detection circuit of the power down detection circuit.

9. The semiconductor memory device according to claim 8, wherein the power down operation comprises resetting of an internal circuit.

10. The semiconductor memory device according to claim 8, wherein the boost circuit is a charging pump circuit operating when a read, program, or erase operation of a NAND memory cell array is performed.

11. The semiconductor memory device according to claim 8, wherein the power down detection circuit operates during a busy period when a read, program, or erase operation is performed.

* * * * *